US010840366B2

(12) United States Patent
Cea et al.

(10) Patent No.: US 10,840,366 B2
(45) Date of Patent: *Nov. 17, 2020

(54) NANOWIRE STRUCTURES HAVING WRAP-AROUND CONTACTS

(71) Applicant: Intel Corporation, Santa Clara, CA (US)

(72) Inventors: Stephen M. Cea, Hillsboro, OR (US); Cory E. Weber, Hillsboro, OR (US); Patrick H. Keys, Portland, OR (US); Seiyon Kim, Portland, OR (US); Michael G. Haverty, Mountain View, CA (US); Sadasivan Shankar, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/592,380

(22) Filed: Oct. 3, 2019

(65) Prior Publication Data

US 2020/0035818 A1   Jan. 30, 2020

Related U.S. Application Data

(63) Continuation of application No. 13/995,914, filed as application No. PCT/US2011/067226 on Dec. 23, 2011, now Pat. No. 10,483,385.

(51) Int. Cl.
*H01L 29/775* (2006.01)
*H01L 29/66* (2006.01)
(Continued)

(52) U.S. Cl.
CPC ............ *H01L 29/775* (2013.01); *B82Y 10/00* (2013.01); *H01L 29/0673* (2013.01);
(Continued)

(58) Field of Classification Search
None
See application file for complete search history.

(56) References Cited

U.S. PATENT DOCUMENTS 4,141,022 A   2/1979   Sigg
4,803,173 A   2/1989   Sill
(Continued)

FOREIGN PATENT DOCUMENTS

CN   101783367 A   7/2010
CN   102214577 A   10/2011
(Continued)

OTHER PUBLICATIONS

Office Action for Chinese Patent Application No. 201180076439.7, dated Dec. 31, 2015, 29 pgs.
(Continued)

*Primary Examiner* — Anthony Ho
*Assistant Examiner* — Kevin Quinto
(74) *Attorney, Agent, or Firm* — Schwabe, Williamson & Wyatt, P.C.

(57) ABSTRACT

Nanowire structures having wrap-around contacts are described. For example, a nanowire semiconductor device includes a nanowire disposed above a substrate. A channel region is disposed in the nanowire. The channel region has a length and a perimeter orthogonal to the length. A gate electrode stack surrounds the entire perimeter of the channel region. A pair of source and drain regions is disposed in the nanowire, on either side of the channel region. Each of the source and drain regions has a perimeter orthogonal to the length of the channel region. A first contact completely surrounds the perimeter of the source region. A second contact completely surrounds the perimeter of the drain region.

20 Claims, 6 Drawing Sheets

(51) Int. Cl.
  *B82Y 10/00* (2011.01)
  *H01L 29/06* (2006.01)
  *H01L 29/417* (2006.01)
  *H01L 29/786* (2006.01)
  *H01L 29/78* (2006.01)
  *H01L 29/16* (2006.01)
  *B82Y 40/00* (2011.01)

(52) U.S. Cl.
  CPC .. *H01L 29/41791* (2013.01); *H01L 29/66439* (2013.01); *H01L 29/66545* (2013.01); *H01L 29/785* (2013.01); *H01L 29/78696* (2013.01); *B82Y 40/00* (2013.01); *H01L 29/16* (2013.01)

(56) References Cited

U.S. PATENT DOCUMENTS

| | | | |
|---|---|---|---|
| 10,483,385 B2* | 11/2019 | Cea | H01L 29/78696 |
| 2004/0112964 A1 | 6/2004 | Empedocles et al. | |
| 2005/0142766 A1 | 6/2005 | Hareland | |
| 2006/0049429 A1 | 3/2006 | Kim et al. | |
| 2006/0149895 A1* | 7/2006 | Pocrass | H05K 5/0278 711/103 |
| 2007/0072335 A1 | 3/2007 | Baik et al. | |
| 2007/0262397 A1 | 11/2007 | Surdeanu et al. | |
| 2008/0247214 A1 | 10/2008 | Ufert | |
| 2008/0258207 A1 | 10/2008 | Radosavljevic et al. | |
| 2009/0186455 A1 | 7/2009 | Bedell et al. | |
| 2010/0052018 A1 | 3/2010 | Cohen et al. | |
| 2010/0193770 A1 | 8/2010 | Bangsaruntip et al. | |
| 2010/0207208 A1 | 8/2010 | Bedell et al. | |
| 2011/0012085 A1 | 1/2011 | Deligianni et al. | |
| 2011/0031473 A1 | 2/2011 | Chang et al. | |
| 2011/0062421 A1 | 3/2011 | Iwayama et al. | |
| 2011/0108804 A1 | 5/2011 | Bangsaruntip et al. | |
| 2011/0233512 A1* | 9/2011 | Yang | B82Y 10/00 257/9 |
| 2011/0272673 A1 | 11/2011 | Chang et al. | |
| 2011/0278539 A1 | 11/2011 | Bangsaruntip et al. | |

FOREIGN PATENT DOCUMENTS

| | | |
|---|---|---|
| KR | 10-2006-0022414 | 3/2006 |
| KR | 10-2010-0110728 | 10/2010 |
| TW | 200532918 | 10/2005 |
| TW | 200913264 | 3/2009 |
| WO | WO 2005/119753 | 12/2005 |
| WO | WO 2009/151001 | 12/2009 |
| WO | WO 2011/009762 | 1/2011 |

OTHER PUBLICATIONS

2nd Office Action for Chinese Patent Application No. 201180076439.7 dated Jul. 15, 2016, 27 pgs.
Third Office Action for Chinese Patent Application No. 201180076439.7 dated Jan. 11, 2017, 14 pgs., English translation.
Office Action from Chinese Patent Application No. 201180076439.7, dated Jul. 4, 2017, 10, pgs.
Office Action for Korean Patent Application No. 10-2014-7018009, dated Aug. 4, 2015, 6 pages.
Office Action from Korean Patent Application No. 10-2014-7018009, dated Feb. 3, 2016, 4 pgs.
Notice of Allowance for Korean Patent Application No. 10-2014-7018009, dated Mar. 15, 2016, 3 pages.
First Office Action for Korean Patent Application No. 10-2016-7015577, dated Jan. 18, 2017, 7 pgs., with English translation.
Notice of Allowance for Korean Patent Application No. 10-2016-7015577, dated Jul. 31, 2017, 3 pages.
International Preliminary Report on Patentability from PCT/US2011/067226 dated Jul. 3, 2014, 6 pgs.
International Search Report and Written Opinion for PCT Patent Application No. PCT/US2011/067226 dated Sep. 17, 2012, 9 Pages.
Notice of Allowance and Search Report for Taiwanese Patent Application No. 101146872 dated Oct. 30, 2014, 4pgs.
Office Action from German Patent Application No. 112011106006.8, dated Oct. 22, 2019, 11 pages.
Office Action from German Patent Application No. 112011106006.8, dated Apr. 17, 2020 11 pages.

* cited by examiner

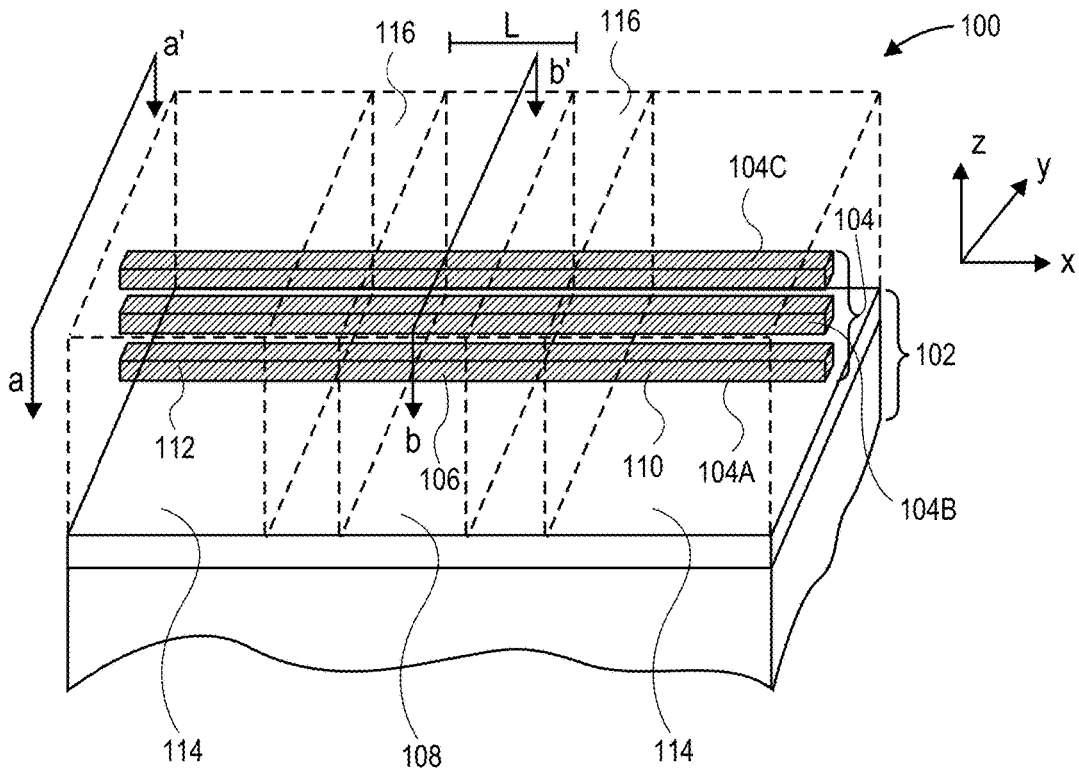
FIG. 1A
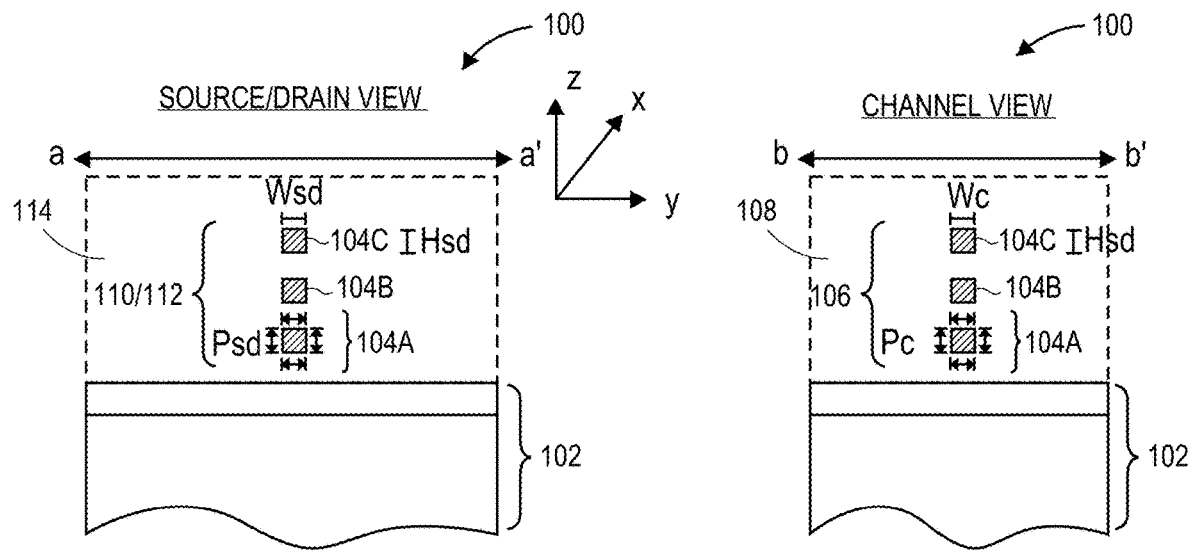
FIG. 1B
FIG. 1C

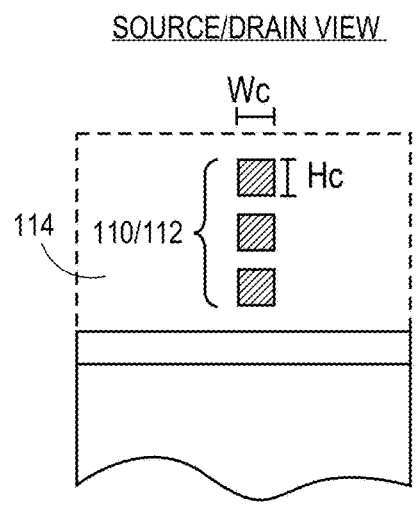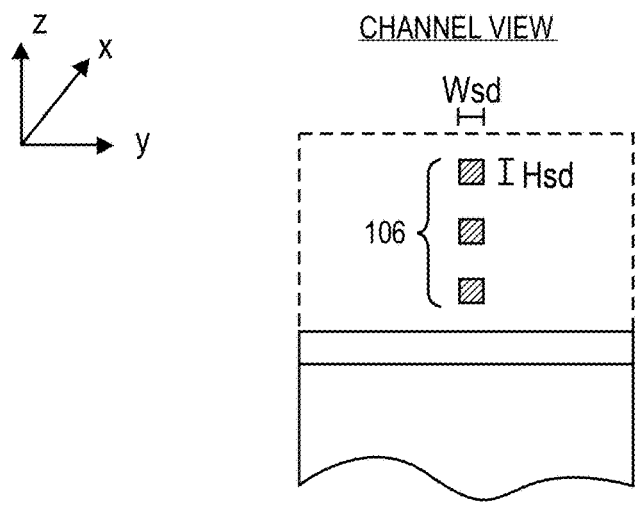
FIG. 2A  FIG. 2B
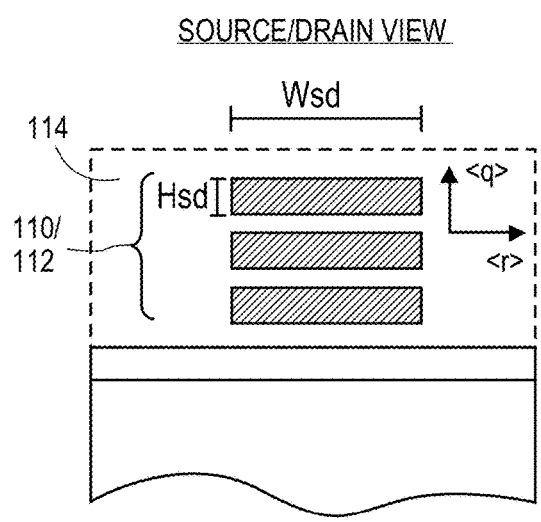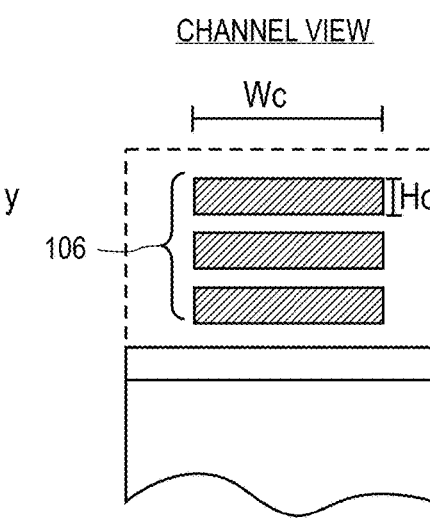
FIG. 3A  FIG. 3B

NANOWIRE STRUCTURES HAVING WRAP-AROUND CONTACTS

CLAIM OF PRIORITY

This application is a continuation of U.S. patent application Ser. No. 13/995,914, filed Jun. 19, 2013, which is a U.S. National Phase application under 35 U.S.C. § 371 of International Application No. PCT/US2011/067226, filed Dec. 23, 2011, entitled "NANOWIRE STRUCTURES HAVING WRAP-AROUND CONTACTS," the entire contents of which are incorporated herein by reference.

TECHNICAL FIELD

Embodiments of the invention are in the field of nanowire semiconductor devices and, in particular, nanowire structures having wrap-around contacts.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Maintaining mobility improvement and short channel control as microelectronic device dimensions scale past the 15 nanometer (nm) node provides a challenge in device fabrication. Nanowires used to fabricate devices provide improved short channel control. For example, silicon germanium ($Si_xGe_{1-x}$) nanowire channel structures (where x<0.5) provide mobility enhancement at respectable Eg, which is suitable for use in many conventional products which utilize higher voltage operation. Furthermore, silicon germanium ($Si_xGe_{1-x}$) nanowire channels (where x>0.5) provide mobility enhanced at lower Egs (suitable for low voltage products in the mobile/handheld domain, for example.

Many different techniques have been attempted to improve external resistance ($R_{ext}$) of transistors including improved contact metals, increased activation of dopant and lowered barriers between the semiconductor and contact metal. However, significant improvements are still needed in the area of $R_{ext}$ reduction.

SUMMARY

Embodiments of the present invention include nanowire structures having wrap-around contacts.

In an embodiment, a nanowire semiconductor device includes a nanowire disposed above a substrate. A channel region is disposed in the nanowire. The channel region has a length and a perimeter orthogonal to the length. A gate electrode stack surrounds the entire perimeter of the channel region. A pair of source and drain regions is disposed in the nanowire, on either side of the channel region. Each of the source and drain regions has a perimeter orthogonal to the length of the channel region. A first contact completely surrounds the perimeter of the source region. A second contact completely surrounds the perimeter of the drain region.

In another embodiment, a semiconductor device includes a plurality of vertically stacked nanowires disposed above a substrate. Each of the nanowires includes a discrete channel region disposed in the nanowire, the channel region having a length and a perimeter orthogonal to the length. Each of the nanowires also includes a pair of discrete source and drain regions disposed in the nanowire, on either side of the channel region. Each of the source and drain regions has a perimeter orthogonal to the length of the channel region. A gate electrode stack surrounds the entire perimeter of each of the channel regions. A pair of contacts is included. A first of the pair of contacts completely surrounds the perimeter of each of the source regions, and a second of the pair of contacts completely surrounds the perimeter of each of the drain regions.

In another embodiment, a method of fabricating a nanowire semiconductor device includes forming a nanowire above a substrate. A channel region is formed in the nanowire, the channel region having a length and a perimeter orthogonal to the length. A gate electrode stack is formed surrounding the entire perimeter of the channel region. A pair of source and drain regions is formed in the nanowire, on either side of the channel region, each of the source and drain regions having a perimeter orthogonal to the length of the channel region. A pair of contacts is formed, a first of the pair of contacts completely surrounding the perimeter of the source region, and a second of the pair of contacts completely surrounding the perimeter of the drain region.

BRIEF DESCRIPTION OF THE DRAWINGS

FIG. 1A illustrates a three-dimensional cross-sectional view of a nanowire-based semiconductor structure, in accordance with an embodiment of the present invention.

FIG. 1B illustrates a cross-sectional source/drain view of the nanowire-based semiconductor structure of FIG. 1A, as taken along the a-a' axis, in accordance with an embodiment of the present invention.

FIG. 1C illustrates a cross-sectional channel view of the nanowire-based semiconductor structure of FIG. 1A, as taken along the b-b' axis, in accordance with an embodiment of the present invention.

FIG. 2A illustrates a cross-sectional source/drain view of another nanowire-based semiconductor structure, in accordance with an embodiment of the present invention.

FIG. 2B illustrates a cross-sectional channel view of the nanowire-based semiconductor structure of FIG. 2A, in accordance with an embodiment of the present invention.

FIG. 3A illustrates a cross-sectional source/drain view of another nanowire-based semiconductor structure, in accordance with an embodiment of the present invention.

FIG. 3B illustrates a cross-sectional channel view of the nanowire-based semiconductor structure of FIG. 3A, in accordance with an embodiment of the present invention.

DETAILED DESCRIPTION

Figure 4A:
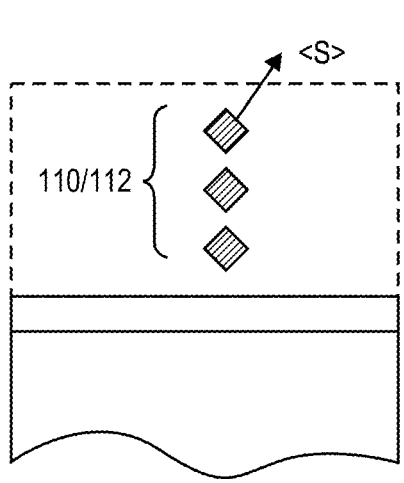
FIG. 4A illustrates a cross-sectional source/drain view of another nanowire-based semiconductor structure, in accordance with an embodiment of the present invention.

Nanowire structures having wrap-around contacts are described. In the following description, numerous specific details are set forth, such as specific nanowire integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Nanowire structures with improved (reduced) contact resistance and methods to fabricate such structures, e.g., with wrap-around contacts, are described herein. One or more embodiments of the present invention are directed at approaches for improving (by increasing) the contact area in source and drain region of a nanowire device or improving the source or drain and contact barrier through orientation engineering, or both. Overall, device performance may be improved by decreasing the contact resistance through either increasing the contact area or decreasing the barrier between the metal and semiconductor.

In an embodiment, a nanowire structure is provided with a contact area (e.g., in the source and drain region) that scales favorably with the number of nanowires. For example, in one embodiment, a nanowire-based structure has a contact area that wraps around each wire providing high contact area for the same pitches. Methods to fabricate such structures are also provided. In one embodiment, a nanowire device has contacts to semiconductors with <111> or <110> orientation. The contact resistance of such devices may show marked improvement since the barrier between the metal and semiconductor is reduced in such cases.

More specifically, one or more embodiments include a single or multiple nanowire structure formed so that (1) the contacts wrap around the source and drain regions to maximize the contact area, (2) the geometry of the wire in the channel versus the source and drain regions are independently tuned to optimize the channel and source or drain contact areas, or (3) both (1) and (2).

A variety of methods may be employed to fabricate nanowire devices that contain source drains with <111> or <110> surface orientations. In an embodiment, such surface orientations improve the barrier between the metal and semiconductor and may be fabricated by, e.g., (1) initiating fabrication with a larger nanowire radius and using an orientation-selective etch to provide <111> facets, (2) depositing a semiconductor material such as silicon or silicon germanium epitaxially to provide <111> facets, (3) depositing and etching to provide the <111> facets, or (4) initiating fabrication with a <110> wafer surface orientation to provide a situation where a majority portion of the nanowire contact is made with <110> silicon. Such embodiments are described in greater detail below.

Overall, one or more approaches described herein may be used to improve drive current in a nanowire-based device by decreasing the contact resistance of the device. As illustrated in embodiments below, this may be achieved by increasing the contact area, decreasing the metal/semiconductor barrier, or both. In one embodiment, a device architecture is provided to maximize the contact area as compared with the channel area for a nanowire structure, along with approaches to fabricate such a device. Device structures described herein and their methods of fabrication may, in an embodiment, facilitate optimization of the channel and contact diameters independently. Additionally, methods are provided suitable for, in an embodiment, fabricating structures suitable to exploit the lower barrier between <111> or <110> silicon and contact metals.

FIG. 1A illustrates a three-dimensional cross-sectional view of a nanowire-based semiconductor structure, in accordance with an embodiment of the present invention. FIG. 1B illustrates a cross-sectional source/drain view of the nanowire-based semiconductor structure of FIG. 1A, as taken along the a-a' axis. FIG. 1C illustrates a cross-sectional channel view of the nanowire-based semiconductor structure of FIG. 1A, as taken along the b-b' axis.

Referring to FIG. 1A, a semiconductor device 100 includes one or more vertically stacked nanowires (104 set) disposed above a substrate 102. Embodiments herein are targeted at both single wire devices and multiple wire devices. As an example, a three nanowire-based devices having nanowires 104A, 104B and 104C is shown for illustrative purposes. For convenience of description, nanowire 104A is used as an example where description is focused on one of the nanowires. It is to be understood that where attributes of one nanowire are described, embodiments based on a plurality of nanowires may have the same attributes for each of the nanowires.

Each of the nanowires 104 includes a channel region 106 disposed in the nanowire. The channel region 106 has a length (L). Referring to FIG. 1C, the channel region also has a perimeter (Pc) orthogonal to the length (L). Referring to both FIGS. 1A and 1C, a gate electrode stack 108 surrounds the entire perimeter (Pc) of each of the channel regions 106. The gate electrode stack 108 includes a gate electrode along with a gate dielectric layer disposed between the channel region 106 and the gate electrode (not shown). The channel region is discrete in that it is completely surrounded by the gate electrode stack 108 without any intervening material such as underlying substrate material or overlying channel fabrication materials. Accordingly, in embodiments having a plurality of nanowires 104, the channel regions 106 of the nanowires are also discrete relative to one another.

Each of the nanowires 104 also includes source and drain regions 110 and 112 disposed in the nanowire on either side of the channel region 104. Referring to FIG. 1B, the source/drain regions 110/112 have a perimeter (Psd) orthogonal to the length (L) of the channel region 104. Referring to both FIGS. 1A and 1B, a pair of contacts 114 surrounds the entire perimeter (Psd) of each of the source/drain regions 110/112. The source/drain regions 110/112 are discrete in that they are completely surrounded by the contacts 114 without any intervening material such as underlying substrate material or overlying channel fabrication materials. Accordingly, in embodiments having a plurality of nanowires 104, the source/drain regions 110/112 of the nanowires are also discrete relative to one another.

Referring again to FIG. 1A, in an embodiment, the semiconductor device 100 further includes a pair of spacers 116. The spacers 116 are disposed between the gate electrode stack 108 and the pair of contacts 114. In an embodiment, although not depicted, the source/drain regions 110/112 of the nanowires 104 are uniformly doped around the perimeter (Psd) of each of the regions. In one such embodiment (also not shown), a doping layer is disposed on and completely surrounding the perimeter of each of the source/drain regions 110/112, between the source/drain regions 110/112 and the contact regions 114. In a specific such embodiment, the doping layer is a boron doped silicon germanium layer, e.g., for a PMOS device. In another specific such embodiment, the doping layer is a phosphorous doped silicon layer, e.g., for an NMOS device.

Substrate 102 may be composed of a material suitable for semiconductor device fabrication. In one embodiment, substrate 102 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxy-nitride is disposed on the lower bulk substrate. Thus, the structure 100 may be fabricated from a starting semiconductor-on-insulator substrate. Alternatively, the structure 100 is formed directly from a bulk substrate and local oxidation is used to form electrically insulative portions in place of the above described upper insulator layer. In another alternative embodiment, the structure 100 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 104 may be sized as wires or ribbons, as described below, and may have squared-off or rounder corners. In an embodiment, the nanowires 104 are composed of a material such as, but not limited to, silicon, germanium, or a combination thereof. In one such embodiment, the nanowires are single-crystalline. For example, for a silicon nanowire 104, a single-crystalline nanowire may be based from a (100) global orientation, e.g., with a <100> plane in the z-direction. As described below, other orientations may also be considered. In an embodiment, the dimensions of the nanowires 104, from a cross-sectional perspective, are on the nano-scale. For example, in a specific embodiment, the smallest dimension of the nanowires 104 is less than approximately 20 nanometers. In an embodiment, the nanowires 104 are composed of a strained material, particularly in the channel regions 106.

In an embodiment, the gate electrode of gate electrode stack 108 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the nanowire 104. In an embodiment, the gate dielectric layer is comprised of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

In an embodiment, the spacers 116 are composed of an insulative dielectric material such as, but not limited to, silicon dioxide, silicon oxy-nitride or silicon nitride. The contacts 114 are, in an embodiment, fabricated from a metal species. The metal species may be a pure metal, such as nickel or cobalt, or may be an alloy such as a metal-metal alloy or a metal-semiconductor alloy (e.g., such as a silicide material).

Referring to FIGS. 1B and 1C, in an embodiment, each of the channel regions 106 has a width (Wc) and a height (Hc), the width (Wc) approximately the same as the height (Hc), and each of the source/drain regions 110/112 has a width (Wsd) and a height (Hsd), the width (Wsd) approximately the same as the height (Hsd). That is, in both cases, the channel regions 106 and the source/drain region 110/112 are square-like or, if corner-rounded, circle-like in cross-section profile. In one such embodiment, Wc and Wsd are approximately the same, and Hc and Hsd are approximately the same, as reflected in FIGS. 1B and 1C.

However, in another aspect, the perimeter of the channel region (Pc) may be smaller than the perimeter of the source/drain regions 110/112 (Psd). For example, in accordance with another embodiment of the present invention, FIG. 2A illustrates a cross-sectional source/drain view of another nanowire-based semiconductor structure. FIG. 2B illustrates a cross-sectional channel view of the nanowire-based semiconductor structure of FIG. 2A.

Referring to FIGS. 2A and 2B, in an embodiment, each of the channel regions 106 has a width (Wc) and a height (Hc), the width (Wc) approximately the same as the height (Hc). Each of the source/drain regions 110/112 has a width (Wsd) and a height (Hsd), the width (Wsd) approximately the same as the height (Hsd). That is, in both cases, the channel regions 106 and the source/drain region 110/112 are square-like or, if corner-rounded, circle-like in cross-section profile. However, in one such embodiment, Wc is less than Wsd, and Hc is less than Hsd, as reflected in FIGS. 2A and 2B. In a specific such embodiments, the perimeters of the source region 110 and the drain region 112 are approximately the same. Accordingly, the perimeters of each of the source/drain regions 110/112 are greater than the perimeter of the channel region 106. Methods to fabricate such an arrangement are described in detail below in association with FIGS. 6A-6E.

In another aspect, width and height of the channel region need not be the same and likewise, the width and height of the source/drain regions need not be the same. For example, in accordance with another embodiment of the present invention, FIG. 3A illustrates a cross-sectional source/drain view of another nanowire-based semiconductor structure. FIG. 3B illustrates a cross-sectional channel view of the nanowire-based semiconductor structure of FIG. 3A.

Referring to FIGS. 3A and 3B, in an embodiment, each of the channel regions 106 has a width (Wc) and a height (Hc). The width (Wc) is substantially greater than the height (Hc). For example, in a specific embodiment, the width Wc is approximately 2-10 times greater than the height Hc. Furthermore, each of the source/drain regions 110/112 has a width (Wsd) and a height (Hsd), the width (Wsd) substantially greater than the height (Hsd). That is, in both cases, the channel regions 106 and the source/drain region 110/112 are rectangular-like or, if corner-rounded, oval-like in cross-section profile. Nanowires with such geometry may be referred to as nanoribbons. In one such embodiment, Wc and Wsd are approximately the same, and Hc and Hsd are approximately the same, as reflected in FIGS. 3A and 3B. However, in another embodiment, the perimeter of the source/drain regions 110/112 is greater than the perimeter of the channel region 106.

Contact resistance may depend on both interface area and the barrier between the metal and semiconductor. In an embodiment, methods to improve contact resistance by reducing the barrier between the metal and semiconductor by selecting the most advantageous semiconductor orientations for the metal to contact are provided. For example, in one embodiment, a starting silicon (Si) wafer orientation is used appropriate for forming a contact all around structure wherein more of the metal/silicon contact will be with <110> oriented silicon. As an exemplary embodiment to illustrate the concept, reference is made again to FIG. 3A.

Referring to FIG. 3A, the surface of the source/drain region 110/112 oriented with Hsd has a <q> crystal orientation. The surface of the source/drain region 110/112 oriented with Wsd has a <r> crystal orientation. In an embodiment, each of the nanowires is composed of silicon, <q> is a <110> orientation, and <r> is a <100> orientation. That is, the perimeter along the width of each of the source and drain regions is composed of exposed <110> silicon surfaces, and the perimeter along the height of each of the source and drain regions is composed of exposed <100> silicon surfaces. Thus a greater portion of the source/drain region 110/112 to contact 114 interface is based on an interaction with <110> silicon surfaces than with <100> silicon surfaces. In an embodiment, such an orientation is achieved by starting with a base silicon substrate or layer having global (110) orientation, as opposed to the conventional (100) global orientation.

In an alternative embodiment (not shown), the nanoribbons are oriented vertically. That is, each of the channel regions has a width and a height, the width substantially less than the height, and each of the source and drain regions has a width and a height, the width substantially less than the height. In one such embodiment, each of the nanowires is composed of silicon, the perimeter along the width of each of the source and drain regions is composed of exposed <100> silicon surfaces, and the perimeter along the height of each of the source and drain regions is composed of exposed <110> silicon surfaces.

Figure 4B:
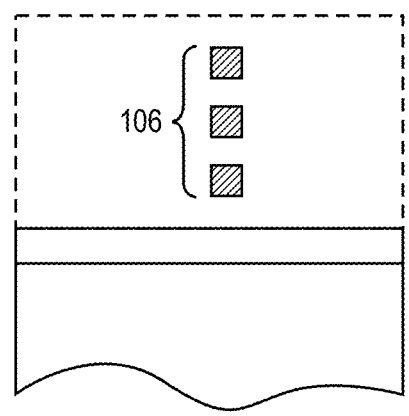
FIG. 4B illustrates a cross-sectional channel view of the nanowire-based semiconductor structure of FIG. 4A, in accordance with an embodiment of the present invention.
Figure 4C:
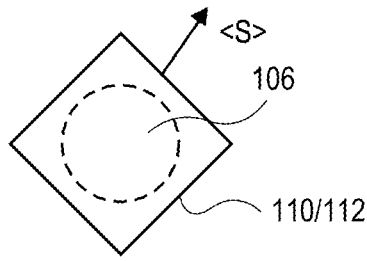
FIG. 4C illustrates the source/drain view of FIG. 4A as superimposed on a channel view, in accordance with an embodiment of the present invention.

In another aspect, a select orientation is formed after formation of a discrete portion of a wire. For example, in accordance with another embodiment of the present invention, FIG. 4A illustrates a cross-sectional source/drain view of another nanowire-based semiconductor structure. FIG. 4B illustrates a cross-sectional channel view of the nanowire-based semiconductor structure of FIG. 4A. FIG. 4C illustrates the source/drain view of FIG. 4A as superimposed on a channel view.

Referring to FIG. 4A, the surface of the source/drain region 110/112 has four planes all oriented with <s>-type crystal orientation. In an embodiment, each of the nanowires is composed of silicon and <s> is a <111> orientation. That is, the perimeter of the entire source/drain regions 110/112 is composed of exposed <111> silicon surfaces. Thus, substantially all, if not entirely all, of the source/drain region 110/112 to contact 114 interface is based on an interaction with <111> silicon surfaces than with <100>-type or <110>-type silicon surfaces. In an embodiment, such an orientation is achieved by starting with a base silicon substrate or layer having global (100) or (110) orientation. In one such embodiment, such a starting orientation is retained in the channel regions 106, as depicted in FIG. 4B and emphasized in FIG. 4C (note that the corners of the channel regions 106 may be squared-off as in FIG. 4B or may be rounded as in FIG. 4C). Methods to fabricate such an arrangement of <111> source/drain regions are described in detail below in association with FIGS. 6A-6E.

As described above, the channel regions and the source/drain regions are, in at least several embodiments, made to be discrete. However, not all regions of the nanowire need be, or even can be made to be discrete. For example, FIG. 5 illustrates a cross-sectional spacer view of a nanowire-based semiconductor structure, in accordance with an embodiment of the present invention.

Figure 5:
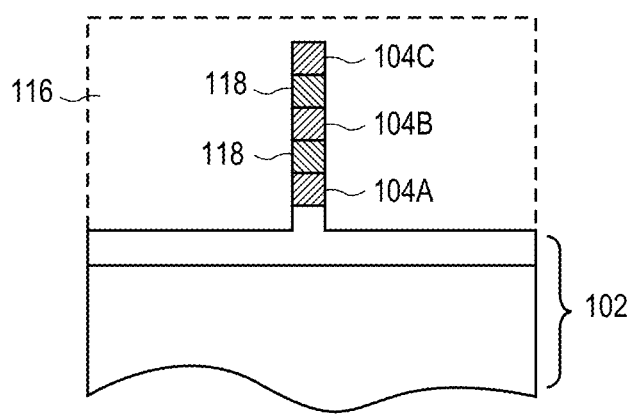
FIG. 5 illustrates a cross-sectional spacer view of a nanowire-based semiconductor structure, in accordance with an embodiment of the present invention.

Referring to FIG. 5, nanowires 104A-104C are not discrete at the location under spacers 116. In one embodiment, the stack of nanowires 104A-104C have intervening semiconductor material 118 there between, such as silicon germanium intervening between silicon nanowires, or vice versa, as described below in association with FIG. 6B. In one embodiment, the bottom nanowire 104A is still in contact with a portion of substrate 102. Thus, in an embodiment, a portion of the plurality of vertically stacked nanowires under one or both of the spacers is non-discrete.

In another aspect, methods of fabricating a nanowire semiconductor device are provided. For example, FIGS. 6A-6E illustrate three-dimensional cross-sectional views representing various operations in a method of fabricating a nanowire semiconductor device, in accordance with an embodiment of the present invention.

Figure 6A:
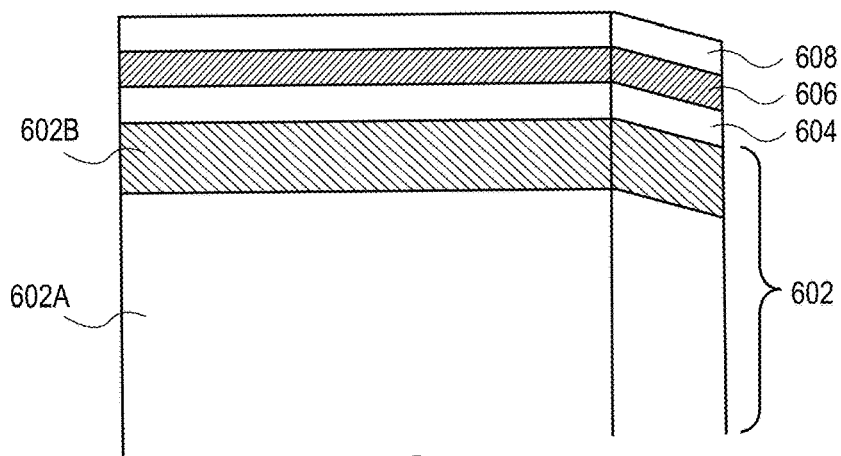
FIGS. 6A-6E illustrate three-dimensional cross-sectional views representing various operations in a method of fabricating a nanowire semiconductor device, in accordance with an embodiment of the present invention.

A method of fabricating a nanowire semiconductor device may include forming a nanowire above a substrate. In a specific example showing the formation of two silicon nanowires, FIG. 6A illustrates a substrate 602 (e.g., composed of a bulk substrate silicon substrate 602A with an insulating silicon dioxide layer 602B there on) having a silicon layer 604/silicon germanium layer 606/silicon layer 608 stack disposed thereon. It is to be understood that, in another embodiment, a silicon germanium layer/silicon layer/silicon germanium layer stack may be used to ultimately form two silicon germanium nanowires.

Figure 6B:
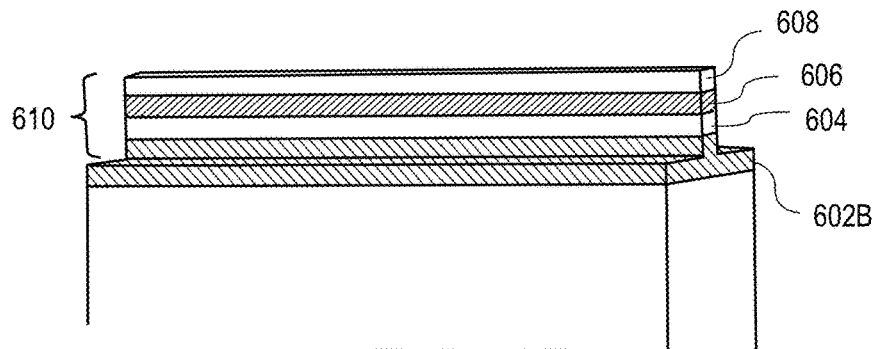

Referring to FIG. 6B, a portion of the silicon layer 604/silicon germanium layer 606/silicon layer 608 stack as well as a top portion of the silicon dioxide layer 602B is patterned into a fin-type structure 610, e.g., with a mask and plasma etch process.

Figure 6C:
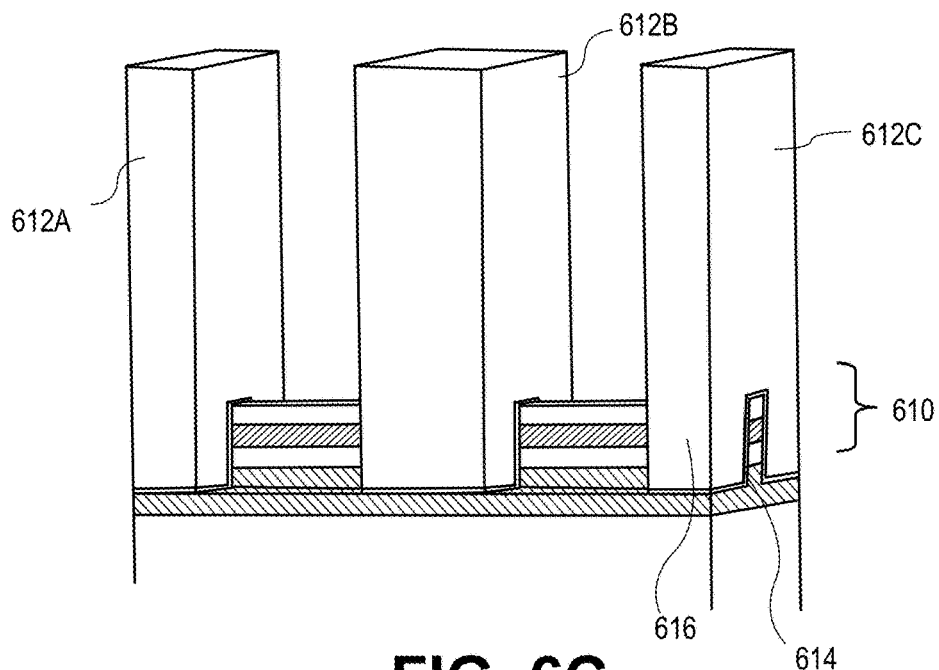

The method may also include forming a channel region in the nanowire, the channel region having a length and a perimeter orthogonal to the length. In a specific example showing the formation of three gate structures over the two silicon nanowires, FIG. 6C illustrates the fin-type structure 610 with three sacrificial gates 612A, 612B, and 612C disposed thereon. In one such embodiment, the three sacrificial gates 612A, 612B, and 612C are composed of a sacrificial gate oxide layer 614 and a sacrificial polysilicon gate layer 616 which are blanket deposited and patterned with a plasma etch process.

Figure 6D:
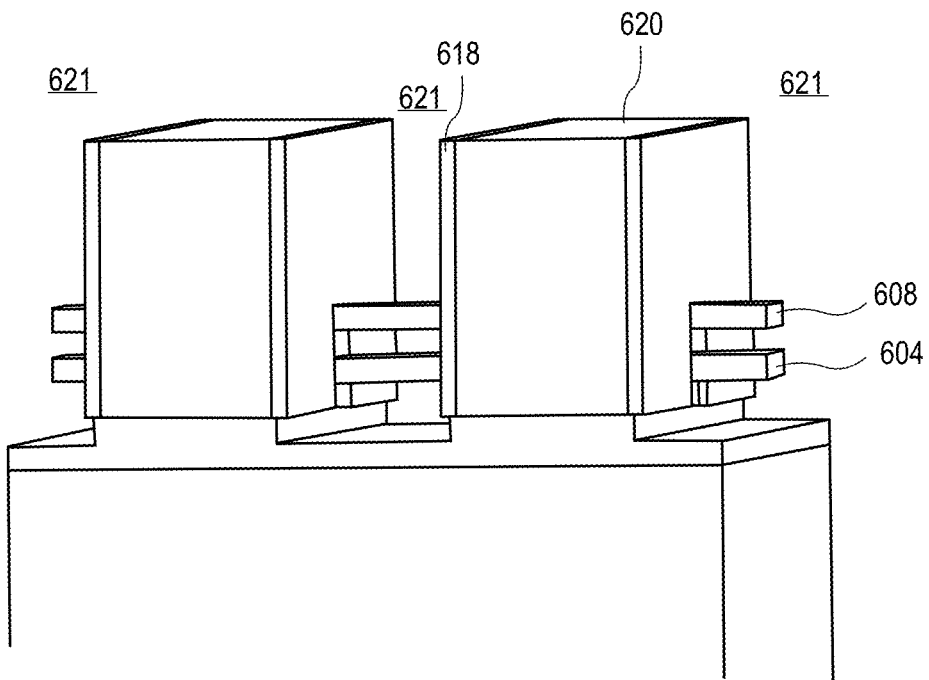

Following patterning to form the three sacrificial gates 612A, 612B, and 612C, spacers may be formed on the sidewalls of the three sacrificial gates 612A, 612B, and 612C, doping may be performed (e.g., tip and/or source and drain type doping), and an interlayer dielectric layer may be formed to cover the three sacrificial gates 612A, 612B, and 612C. The interlayer dielectric layer may be polished to expose the three sacrificial gates 612A, 612B, and 612C for a replacement gate, or gate-last, process. Referring to FIG. 6D, the three sacrificial gates 612A, 612B, and 612C have been removed, leaving spacers 618 and a portion of the interlayer dielectric layer 620 remaining.

Additionally, referring again to FIG. 6D the portions of the silicon germanium layer 606 and the portion of the insulating silicon dioxide layer 602B of the fin structure 610 are removed in the regions originally covered by the three sacrificial gates 612A, 612B, and 612C. Discrete portions of the silicon layers 604 and 608 thus remain, as depicted in FIG. 6D.

The discrete portions of the silicon layers 604 and 608 shown in FIG. 6D will, in one embodiment, ultimately become channel regions in a nanowire-based device. Thus, at the process stage depicted in FIG. 6D, channel engineering or tuning may be performed. For example, in one embodiment, the discrete portions of the silicon layers 604 and 608 shown in FIG. 6D are thinned using oxidation and etch processes. Such an etch process may be performed at the same time the wires are separated by etching the silicon germanium layer 606. Accordingly, the initial wires formed from silicon layers 604 and 608 begin thicker and are thinned to a size suitable for a channel region in a nanowire device, independent from the sizing of the source and drain regions of the device. Thus, in an embodiment, forming the channel region includes removing a portion of the nanowire, and the resulting perimeters of the source and drain regions (described below) are greater than the perimeter of the resulting channel region.

Figure 6E:
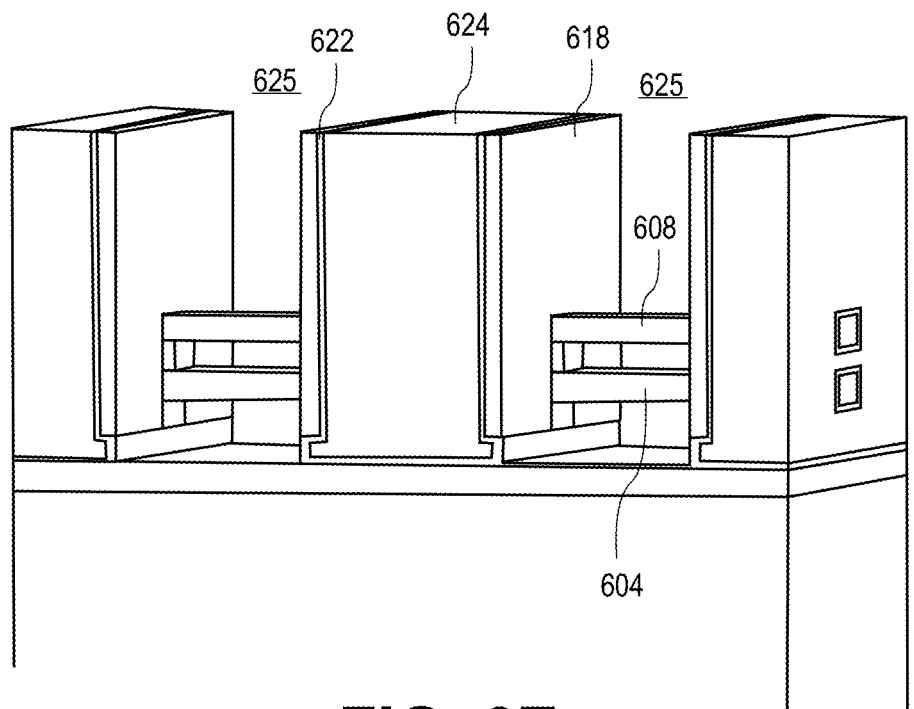

The method may also include forming a gate electrode stack surrounding the entire perimeter of the channel region. In the specific example showing the formation of three gate structures over the two silicon nanowires, FIG. 6E illustrates the structure following deposition of a gate dielectric layer 622 (such as a high-k gate dielectric layer) and a gate electrode layer 624 (such as a metal gate electrode layer), and subsequent polishing, in between the spacers 618. That is, gate structures are formed in the trenches 621 of FIG. 6D. Additionally, FIG. 6E depicts the result of the subsequent removal of the interlayer dielectric layer 620 after formation of the permanent gate stack. The portions of the silicon germanium layer 606 and the portion of the insulating silicon dioxide layer 602B of the fin structure 610 are also removed in the regions originally covered by the portion of the interlayer dielectric layer 620 depicted in FIG. 6D. Discrete portions of the silicon layers 604 and 608 thus remain, as depicted in FIG. 6E.

The method may also include forming a pair of source and drain regions in the nanowire, on either side of the channel region, each of the source and drain regions having a perimeter orthogonal to the length of the channel region. Specifically, the discrete portions of the silicon layers 604 and 608 shown in FIG. 6E will, in one embodiment, ultimately become at least a portion of, if not entirely, the source and drain regions in a nanowire-based device. Thus, at the process stage depicted in FIG. 6E, source and drain region engineering or tuning may be performed, example of which follow. It is to be understood that similar engineering or tuning may instead be performed earlier in a process flow, e.g., prior to deposition of an interlayer dielectric layer and formation of permanent gate electrodes.

In an embodiment, forming the pair of source and drain regions includes growing (e.g., by epitaxial growth) to expand a portion of the nanowire. The perimeters of the source and drain regions may be fabricated to be greater than the perimeter of the channel region in this way. In one such embodiment, the nanowire is composed of silicon, and growing the portion of the nanowire includes forming exposed <111> silicon surfaces along the entire perimeter of each of the source and drain regions. In a specific such embodiment, forming the exposed <111> silicon surfaces includes using a deposition and subsequent selective facted etch process. Thus, <111> oriented surfaces may be fabricated by either depositing epitaxial silicon to directly provide <111> facets or by depositing silicon and using an orientation dependent silicon etch. In yet another embodiment, the process begins with a thicker nanowire followed by subsequent etching using an orientation dependent silicon etch. In an embodiment, forming the pair of source and drain regions includes forming a doping layer on and completely surrounding the perimeter of each of the source and drain regions, e.g., a boron doped silicon germanium layer. This layer may facilitate formation of a nanowire with a uniformly doped perimeter.

The method may also include forming a pair of contacts, a first of the pair of contacts completely surrounding the perimeter of the source region, and a second of the pair of contacts completely surrounding the perimeter of the drain region. Specifically, contacts are formed in the trenches 625 of FIG. 6E. The resulting structure may be similar to, or the same as, the structure 100 of FIG. 1A. In an embodiment, the contacts are formed from a metallic species. In one such embodiment, the metallic species is formed by conformally depositing a contact metal and then filling any remaining trench volume. The conformal aspect of the deposition may be performed by using chemical vapor deposition (CVD), atomic layer deposition (ALD), or metal reflow.

Thus, embodiments of the present invention include methods to fabricate nanowire structures with contacts all around, methods of tuning the channel and contact locations (i.e., source and drain regions) areas differently, or methods of doing both in the same process. Structures formed from such methods may provide Rext improvements (reduction) versus conventional structures.

In an embodiment, the contact metal is wrapped all around the nanowire in the source and drain allowing for maximized contact area. In another embodiment, the ability to tailor the wire sizes or geometries, or both in the source/drain independent from the channel, and vice versa, is provided. Such approaches may achieve the best transistor performance possible in a nanowire-based device. Since contact resistance is inversely proportional to the contact area in a device, embodiments described herein may be used to increase the contact area and decrease the contact resistance of the device. In a specific such embodiment, <111> or <110> orientated silicon is used to improve metal/semiconductor barrier interactions. Large reduction in contact resistances have been computed for such orientations. Specifically, current versus bias for three surface orientations showing Si(111) and Si(110) orientations have a reduced Schottky Barrier Height as well as changes in the density of states leading to a higher overall current versus the Si(100) orientation.

Figure 7:
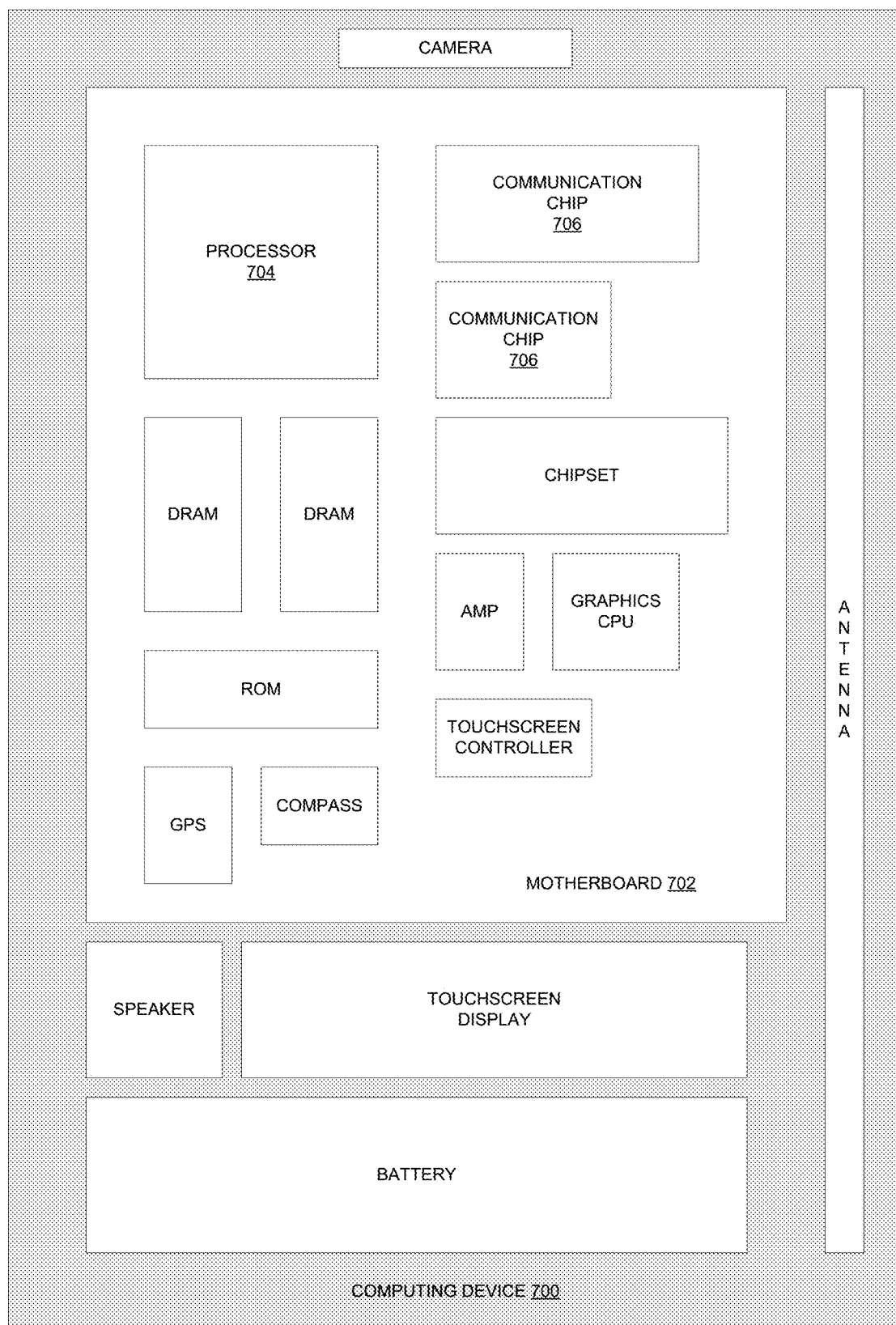
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as nanowire transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as nanowire transistors built in accordance with implementations of the invention.

In further implementations, another component housed within the computing device 700 may contain an integrated circuit die that includes one or more devices, such as nanowire transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Thus, nanowire structures having wrap-around contacts have been disclosed. In an embodiment, a nanowire semiconductor device includes a nanowire disposed above a substrate. A channel region is disposed in the nanowire. The channel region has a length and a perimeter orthogonal to the length. A gate electrode stack surrounds the entire perimeter of the channel region. A pair of source and drain regions is disposed in the nanowire, on either side of the channel region. Each of the source and drain regions has a perimeter orthogonal to the length of the channel region. A first contact completely surrounds the perimeter of the source region. A second contact completely surrounds the perimeter of the drain region. In one embodiment, the perimeters of the source and drain regions are approximately the same, and are greater than the perimeter of the channel region.

What is claimed is:

1. A semiconductor device, comprising:
a plurality of vertically stacked nanowires disposed above a substrate, each of the nanowires comprising:
a discrete channel region disposed in the nanowire, the channel region having a length and a perimeter orthogonal to the length, wherein the perimeter of the channel region is a smallest perimeter of the nanowire;
a pair of source or drain regions disposed in the nanowire, on either side of the channel region, each of the source or drain regions comprising a portion having a perimeter orthogonal to the length of the channel region, wherein the perimeters of the portions of the source or drain regions are approximately the same, and are greater than the perimeter of the channel region at locations immediately adjacent the channel region, and wherein the smallest perimeter of the nanowire is at the locations where the portions of the source or drain regions are immediately adjacent the channel region;
a gate electrode stack surrounding and in contact with the entire perimeter of each of the channel regions;
a pair of spacers adjacent the gate electrode stack; and
an intervening semiconductor material between and in contact with the plurality of vertically stacked nanowires but not along sidewalls of the nanowires at a location beneath the pair of spacers.

2. The semiconductor device of claim 1, wherein each of the channel regions has a width and a height, the width approximately the same as the height, and wherein each of the portions of the source or drain regions has a width and a height, the width approximately the same as the height.

3. The semiconductor device of claim 1, wherein each of the nanowires consists essentially of silicon, and the entire perimeter of each of the portions of the source or drain regions is an exposed <111> silicon surface.

4. The semiconductor device of claim 1, wherein the gate electrode stack comprises a metal gate and a high-k gate dielectric, and each of the nanowires comprises silicon, germanium, or a combination thereof.

5. The semiconductor device of claim 1, wherein each of the channel regions has a width and a height, the width substantially greater than the height, and wherein each of the portions of the source or drain regions has a width and a height, the width substantially greater than the height.

6. The semiconductor device of claim 5, wherein each of the nanowires consists essentially of silicon, the perimeter along the width of each of the portions of the source or drain regions comprises exposed <110> silicon surfaces, and the perimeter along the height of each of the portions of the source or drain regions comprises exposed <100> silicon surfaces.

7. The semiconductor device of claim 1, wherein each of the channel regions has a width and a height, the width substantially less than the height, and wherein each of the portions of the source or drain regions has a width and a height, the width substantially less than the height.

8. The semiconductor device of claim 7, wherein each of the nanowires consists essentially of silicon, the perimeter along the width of each of the portions of the source or drain regions comprises exposed <100> silicon surfaces, and the perimeter along the height of each of the portions of the source or drain regions comprises exposed <110> silicon surfaces.

9. A computing device, comprising:
a board; and
a component coupled to the board, the component including an integrated circuit structure, comprising:
 a plurality of vertically stacked nanowires disposed above a substrate, each of the nanowires comprising:
  a discrete channel region disposed in the nanowire, the channel region having a length and a perimeter orthogonal to the length, wherein the perimeter of the channel region is a smallest perimeter of the nanowire;
  a pair of source or drain regions disposed in the nanowire, on either side of the channel region, each of the source or drain regions comprising a portion having a perimeter orthogonal to the length of the channel region, wherein the perimeters of the portions of the source or drain regions are approximately the same, and are greater than the perimeter of the channel region at locations immediately adjacent the channel region, and wherein the smallest perimeter of the nanowire is at the locations where the portions of the source or drain regions are immediately adjacent the channel region;
 a gate electrode stack surrounding and in contact with the entire perimeter of each of the channel regions;
 a pair of spacers adjacent the gate electrode stack; and
 an intervening semiconductor material between and in contact with the plurality of vertically stacked nanowires but not along sidewalls of the nanowires at a location beneath the pair of spacers.

10. The computing device of claim 9, further comprising:
a memory coupled to the board.

11. The computing device of claim 9, further comprising:
a communication chip coupled to the board.

12. The computing device of claim 9, further comprising:
a camera coupled to the board.

13. The computing device of claim 9, further comprising:
a battery coupled to the board.

14. The computing device of claim 9, further comprising:
an antenna coupled to the board.

15. The computing device of claim 9, wherein the component is a packaged integrated circuit die.

16. The computing device of claim 9, wherein the component is selected from the group consisting of a processor, a communications chip, and a digital signal processor.

17. The computing device of claim 9, wherein the computing device is selected from the group consisting of a mobile phone, a laptop, a desk top computer, a server, and a set-top box.

18. The computing device of claim 9, wherein each of the channel regions has a width and a height, the width approximately the same as the height, and wherein each of the portions of the source or drain regions has a width and a height, the width approximately the same as the height.

19. The computing device of claim 9, wherein each of the channel regions has a width and a height, the width substantially greater than the height, and wherein each of the portions of the source or drain regions has a width and a height, the width substantially greater than the height.

20. The computing device of claim 9, wherein the gate electrode stack comprises a metal gate and a high-k gate dielectric, and each of the nanowires comprises silicon, germanium, or a combination thereof.

* * * * *